United States Patent
Cho et al.

(10) Patent No.: US 8,253,251 B2
(45) Date of Patent: Aug. 28, 2012

(54) METHOD FOR PRODUCING LOW-K FILM, SEMICONDUCTOR DEVICE, AND METHOD FOR MANUFACTURING THE SAME

(75) Inventors: Yoshinori Cho, Tokyo (JP); Takamaro Kikkawa, Higashihiroshima (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 13/222,817

(22) Filed: Aug. 31, 2011

(65) Prior Publication Data

US 2011/0309511 A1    Dec. 22, 2011

Related U.S. Application Data

(62) Division of application No. 12/617,040, filed on Nov. 12, 2009, now Pat. No. 8,030,221.

(30) Foreign Application Priority Data

May 13, 2009 (JP) .................. 2009-116601

(51) Int. Cl.
 *H01L 23/48* (2006.01)
(52) U.S. Cl. .................. 257/758; 257/760
(58) Field of Classification Search .......... 257/758–760; 438/780–782, 788–790, 622–624
See application file for complete search history.

(56) References Cited

U.S. PATENT DOCUMENTS

| 7,585,789 B2 | 9/2009 | Hyodo et al. |
| 8,030,221 B2* | 10/2011 | Cho et al. .................. 438/781 |

FOREIGN PATENT DOCUMENTS

| JP | 2004-79592 | 3/2004 |
| JP | 2004-311532 | 11/2004 |
| JP | 2005-210111 | 8/2005 |
| JP | 2007-149954 | 6/2007 |
| KR | 10-2008-0022316 | 3/2008 |

OTHER PUBLICATIONS

Cho, Y. et al. (2008), "Pure Silica Zeolite Films Prepared by a Vapor Phase Transport Method," *Japanese Journal of Applied Physics*, 47(11): 8360-8363.

Korean Office Action mailed on May 16, 2011, directed towards counterpart Korean patent application No. 10-2010-0001656; 11 pages.

* cited by examiner

*Primary Examiner* — Richard A. Booth
(74) *Attorney, Agent, or Firm* — Morrison & Foerster LLP

(57) ABSTRACT

Hydrophobicity of a low dielectric constant film comprising a porous silica film is improved by applying a raw material for forming a porous silica film onto a substrate, and performing vapor-phase transport treatment to expose the substrate to an atmosphere of organic amine vapor to which no water is added. Simultaneously, reduction in a dielectric constant, reduction in leakage current, and improvement in mechanical strength are attained by controlling a pore diameter in a predetermined range.

17 Claims, 7 Drawing Sheets

METHOD FOR PRODUCING LOW-K FILM, SEMICONDUCTOR DEVICE, AND METHOD FOR MANUFACTURING THE SAME

REFERENCE TO RELATED APPLICATIONS

This application is a divisional of U.S. patent application Ser. No. 12/617,040 filed Nov. 12, 2009, which claims the priority of Japanese Patent Application No. 2009-116601 filed May 13, 2009, the contents of which are incorporated herein by reference.

BACKGROUND OF THE INVENTION

1. Field of the Invention

The present invention relates to a method for producing a low dielectric constant (low-k) film, and specifically, relates to a method for producing a low-k film comprising porous silica. The present invention also relates to a semiconductor device including a low-k film produced by the method, and a method for manufacturing the semiconductor device.

2. Description of the Related Art

Highly integrated semiconductor circuits with ultra-high speed have caused a problem of increase in signal delay time and power consumption in a multilevel interconnect structure. The signal delay time is determined by the resistance-capacitance (RC) delay, which is a product of an interconnect resistance and an interconnect capacitance. The interconnect resistance increases when an interconnect width is reduced, and the interconnect capacitance increases when an interconnect pitch is reduced. Therefore, the signal delay time increases along with miniaturization. Moreover, the power consumption is determined by a product of a clock frequency, an interconnect capacitance, and a supply voltage. Lowering of a supply voltage is effective for reduction of the power consumption. However, the generation of LSIs having a minimum working dimension of 90 nm, for example, already has the supply voltage of approximately 1V. Due to restrictions on threshold voltage at which a MOSFET can operate, further significant reduction in the supply voltage can no longer be expected. Therefore, the interconnect capacitance needs to be reduced unless the operation clock frequency is reduced.

Two methods are effective for reduction of the signal delay time and the power consumption: one is to reduce the interconnect resistance, and the other is to reduce the interconnect capacitance. In order to improve the interconnect resistance, introduction of a cupper interconnect having a resistivity lower than a resistivity of an aluminum interconnect has been advanced. On the other hand, in order to improve the interconnect capacitance, a porous silica (porous $SiO_2$) film as a low-k material has been investigated as an alternative to bulk $SiO_2$, a material that has conventionally been used as an interlayer insulating film in an interconnect.

It has been thought that porosification is an essential technique in order to attain a material having a lower dielectric constant, and various methods for forming a porous film have been proposed. JP-A-2005-210111 has proposed a method for improving mechanical strength of a low-k film made of a porous film, in which a material for forming a low-k film comprising a first particulate which contains a combination of a silicon atom and an oxygen atom around an organic polymer and to which second particles having a pore are adhered. While the mechanical strength improves, the dielectric constant depends on the resin of a bulk. The dielectric constant of the formed insulating film itself has not been evaluated at all, either. JP-A-2007-149954 has disclosed a method in which a siloxane oligomer is deposited on a substrate by a plasma polymerization reaction using a plasma CVD apparatus, and an organic amine (tetrapropylammonium aqueous solution) is made to act on the deposited siloxane oligomer to form a porous film. JP-A-2004-311532 has disclosed a method for forming a porous film by heat treating a precursor formed on substrate by a coating method multiple times.

However, formation of the porous film causes such problems as reduction in mechanical strength as a solid body and increase in adsorbed water.

As an example of formation of the porous film, when a porous silica film is used as the porous film, a silica precursor material (TEOS, etc.) containing a pore generator is used to form a thin film on a substrate. Subsequently, the substrate is heat treated so that the pore generator volatilizes and pores are formed in the thin film. However, hydrophilic Si—OH bonds are formed on the pore surface after heat treatment, and water absorption that takes place for a very short time in the process causes increase in the dielectric constant and deterioration of leakage current. Additionally, there is a problem of difficulties in control of a pore diameter so that mechanical strength reduces.

SUMMARY

In consideration of the problems that the above-mentioned related art has, an object of the present invention is to provide a method for producing a low dielectric constant film comprising a porous silica film in which hydrophobicity of the low dielectric constant film comprising the porous silica film is improved, and reduction in dielectric constant, reduction in leakage current, and improvement in mechanical strength are attained by controlling a pore diameter in a predetermined range. Other object of the present invention is to provide a semiconductor device including a low dielectric constant film produced by such a method and a method for manufacturing the semiconductor device.

The present inventors have performed the following investigation for a method for improving the hydrophobicity of the porous silica film, i.e., a method for reducing Si—OH bonds on a surface of a pore in the porous silica film.

A hydrophobizing method was studied in which a silica precursor compounded and synthesized in advance was used to form a thin film on a substrate by a coating method; the substrate was placed within an autoclave in which organic amine retained; subsequently, vapor-phase transport treatment to expose the silica precursor to a vapor generated by heating the organic amine was performed to accelerate a dehydration condensation reaction of the silica precursor and the details of the study are published in JJAP (*Japanese Journal of Applied Physics, Vol. 47, No. 11*, 2008, pp. 8360-8363). At that stage of the study, in the expectation that the dehydration condensation reaction of the silica precursor would be accelerated, a mixed solution obtained by adding water ($H_2O$) to the organic amine was used as a vapor source.

A result showing that hydrophobicity is manifested in the porous silica film by this method and that the method is effective for reduction in leakage current and dielectric constant was obtained. On the other hand, however, an average of a pore diameter was large, and distribution of the diameter was wide. In other words, a result showing difficulties in control of the pore diameter was also obtained. An interlayer insulating film used in a manufacturing process of a semiconductor is exposed to an environment where heat stress and mechanical stress are applied. In such view, the presence of a larger pore diameter causes reduction in mechanical strength, and is not preferable.

In addition to the above-mentioned study, various experiments were performed in the present invention in order to control the pore diameter in the porous silica film while maintaining hydrophobicity of the porous silica film. As a result, it was found that a most effective method for controlling the pore diameter in the porous silica film is to add no water, which was added to the organic amine in the expectation that the dehydration condensation reaction of the silica precursor would be accelerated. Thus, the present invention was made.

That is, according to one embodiment of the present invention, there is provided a method for producing a low dielectric constant film comprising a porous silica film including:

forming a porous silica precursor film on a substrate by applying a raw material for forming a porous silica film to the substrate; and performing a vapor-phase transport treatment on the porous silica precursor film by exposing the porous silica precursor film formed on the substrate to an atmosphere of an organic amine vapor to which no water is added.

According to one embodiment of the present invention, a low dielectric constant film comprising a porous silica film is provided, in which hydrophobicity of the low dielectric constant film can be improved, a pore diameter can be controlled in a predetermined range, and reduction in dielectric constant, reduction in leakage current, and improvement in mechanical strength are attained. Moreover, in a semiconductor device including the low dielectric constant film according to one embodiment of the present invention as an interlayer insulating film, reduction in leakage current and improvement in mechanical strength can be attained as well as reduction of a parasitic capacitance, so that a highly reliable semiconductor device can be provided.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE REFERRED EMBODIMENTS

Figure 1:
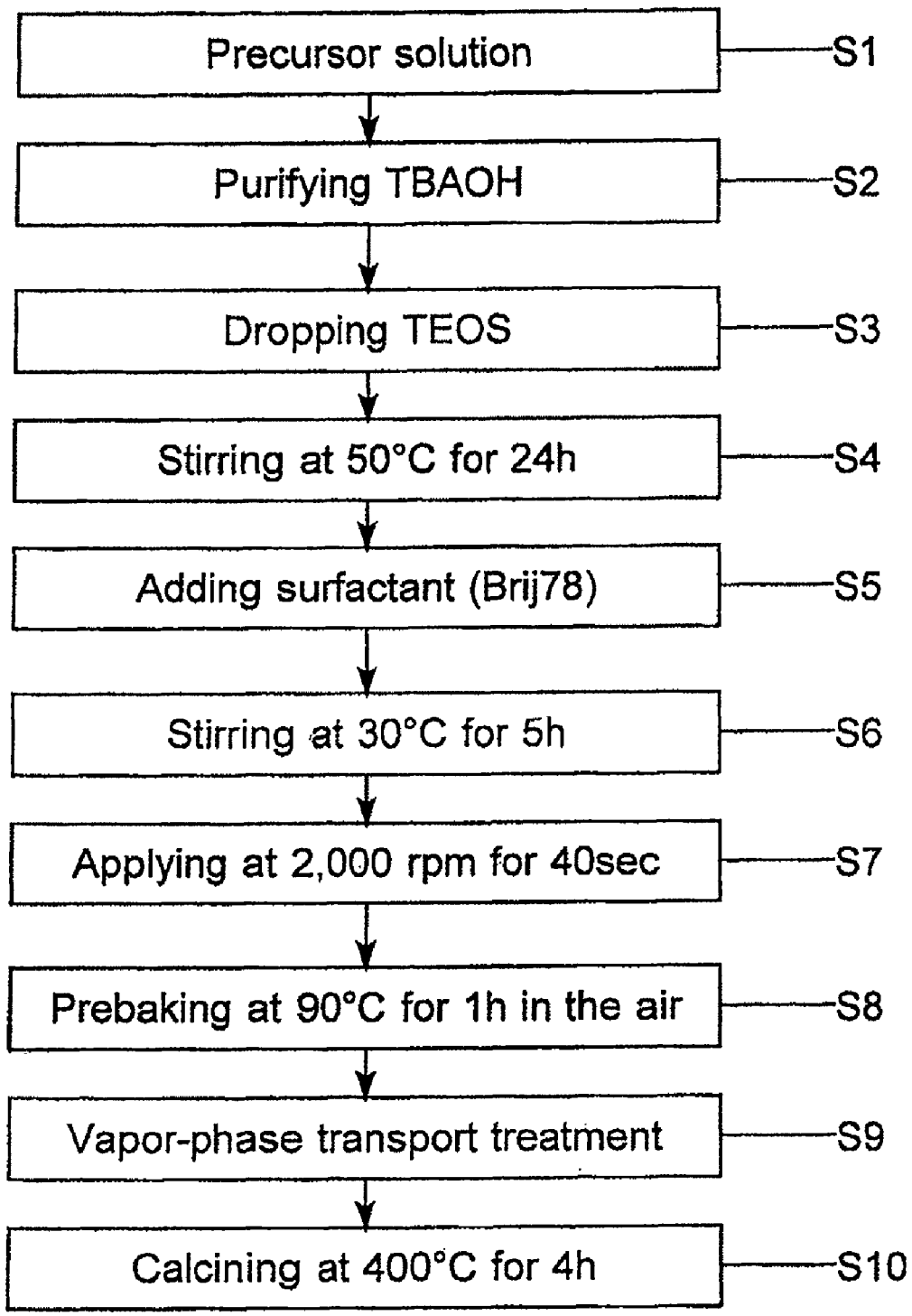
FIG. 1 is a flow chart illustrating a manufacturing process of a porous silica film according to one example of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

The present invention includes: synthesizing by stirring a silica precursor, a catalyst, water, a solvent, and a pore generator to prepare a raw material for forming a porous silica film; applying thus prepared raw material onto a substrate to form a porous silica precursor film; performing a vapor-phase transport treatment on the porous silica precursor film formed on the substrate to accelerate polymerization of the silica precursor and simultaneously hydrophobizing the silica precursor; and converting the porous silica precursor film into a porous silica film by heat treatment for densification. Hereinafter, description will be given on compositions of the raw material for forming the porous silica film and each process of forming the porous silica film.

(Raw Material for Forming Porous Silica Film)

A polysiloxane is used as a silica precursor of the present invention. As the polysiloxane, hydrolysis condensates of compounds represented by general formula (1) can be used.

$$R_nSiX_{4-n} \tag{1}$$

(wherein R represents a hydrogen atom or an organic group having 1 to 20 carbon atoms, X independently represents a hydrolyzable group, and n is an integer of 0 to 2. When n is 2, R may be the same or different.)

The hydrolyzable group X in the general formula (1) can include alkoxy groups, halogen atoms, acetoxy groups, isocyanate groups, for example. From viewpoints of stability in a liquid state, coating properties, and the like of the raw material for forming the porous silica film, alkoxy groups are particularly preferable.

Compounds whose hydrolyzable group X is an alkoxy group (alkoxysilanes) include tetraalkoxysilanes, trialkoxysilanes, and diorgano dialkoxy silanes. Tetraalkoxysilanes include tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane. Trialkoxysilanes include trimethoxysilane, triethoxysilane, tripropoxysilane, fluoro trimethoxysilane, fluoro triethoxysilane, methyl trimetoxysilane, methyl triethoxysilane, methyl tri-n-propoxysilane, methyl tri-iso-propoxysilane, methyl tri-n-butoxysilane, methyl tri-iso-butoxysilane, methyl tri-tert-butoxysilane, methyl triphenoxysilane, ethyl trimethoxysilane, ethyl triethoxysilane, ethyl tri-n-propoxysilane, ethyl tri-iso-propoxysilane, ethyl tri-n-butoxysilane, ethyl tri-iso-butoxysilane, ethyl tri-tert-butoxysilane, ethyl triphenoxysilane, n-propyl trimethoxysilane, n-propyl triethoxysilane, n-propyl tri-n-propoxysilane, n-propyl tri-iso-propoxysilane, n-propyl tri-n-butoxysilane, n-propyl tri-iso-butoxysilane, n-propyl tri-tert-butoxysilane, n-propyl triphenoxysilane, iso-propyl trimethoxysilane, iso-propyl triethoxysilane, iso-propyl tri-n-propoxysilane, iso-propyl tri-iso-propoxysilane, iso-propyl tri-n-butoxysilane, iso-propyl tri-iso-butoxysilane, iso-propyl tri-tert-butoxysilane, iso-propyl triphenoxysilane, n-butyl trimethoxysilane, n-butyl triethoxysilane, n-butyl tri-n-propoxysilane, n-butyl tri-iso-propoxysilane, n-butyl tri-n-butoxysilane, n-butyl tri-iso-butoxysilane, n-butyl tri-tert-butoxysilane, n-butyl triphenoxysilane, sec-butyl trimethoxysilane, sec-butyl triethoxysilane, sec-butyl tri-n-propoxysilane, sec-butyl tri-iso-propoxysilane, sec-butyl tri-n-butoxysilane, sec-butyl tri-iso-butoxysilane, sec-butyl tri-tert-butoxysilane, sec-butyl triphenoxysilane, t-butyl trimethoxysilane, t-butyl triethoxysilane, t-butyl tri-n-propoxysilane, t-butyl tri-iso-propoxysilane, t-butyl tri-n-butoxysilane, t-butyl tri-iso-butoxysilane, t-butyl tri-tert-butoxysilane, t-butyl triphenoxysilane, phenyl trimethoxysilane, phenyl triethoxysilane, phenyl tri-n-propoxysilane, phenyl tri-iso-propoxysilane, phenyl tri-n-butoxysilane, phenyl tri-iso-butoxysilane, phenyl tri-tert-butoxysilane, phenyl triphenoxysilane, trifluoromethyl trimethoxysilane, pentafluoroethyl trimethoxysilane, 3,3,3-trifluoropropyl trimetoxysilane, and 3,3,3-trifluoropropyl triethoxysilane. Diorgano dialkoxysilanes include dimethyl dimethoxysilane, dimethyl diethoxysilane, dimethyl di-n-propoxysilane, dimethyl di-iso-propoxysilane, dimethyl di-n-butoxysilane, dimethyl di-sec-butoxysilane, dimethyl di-tert-butoxysilane, dimethyl diphenoxysilane, diethyl dimethoxysilane, diethyl diethoxysilane, diethyl di-n-propoxysilane, diethyl di-iso-propoxysilane, diethyl di-n-butoxysilane, diethyl di-sec-butoxysilane, diethyl di-tert-butoxysilane, diethyl diphenoxysilane, di-n-propyl dimethoxysilane, di-n-propyl diethoxysilane, di-n-propyl di-n-propoxysilane, di-n-propyl di-iso-propoxysilane, di-n-propyl di-n-butoxysilane, di-n-propyl di-sec-butoxysilane, di-n-propyl di-tert-butoxysilane, di-n-propyl diphenoxysilane, di-iso-propyl dimethoxysilane, di-iso-propyl diethoxysilane, di-iso-propyl di-n-propoxysilane, di-iso-propyl di-iso-propoxysilane, di-iso-propyl di-n-butoxysilane, di-iso-propyl di-sec-butoxysilane, di-iso-propyl di-tert-butoxysilane, di-iso-propyl diphenoxysilane, di-n-butyl dimethoxysilane, di-n-butyl diethoxysilane, di-n-butyl di-n-propoxysilane, di-n-butyl di-iso-propoxysilane, di-n-butyl di-n-butoxysilane, di-n-butyl di-sec-butoxysilane, di-n-butyl di-tert-butoxysilane, di-n-butyl diphenoxysilane, di-sec-butyl dimethoxysilane, di-sec-butyl diethoxysilane, di-sec-butyl di-n-propoxysilane, di-sec-butyl di-iso-propoxysilane, di-sec-butyl di-n-butoxysilane, di-sec-butyl di-sec-butoxysilane, di-sec-butyl di-tert-butoxysilane, di-sec-butyl diphenoxysilane, di-tert-butyl dimethoxysilane, di-tert-butyl diethoxysilane, di-tert-butyl di-n-propoxysilane, di-tert-butyl di-iso-propoxysilane, di-tert-butyl di-n-butoxysilane, di-tert-butyl di-sec-butoxysilane, di-tert-butyl di-tert-butoxysilane, di-tert-butyl diphenoxysilane, diphenyl dimethoxysilane, diphenyl diethoxysilane, diphenyl di-n-propoxysilane, diphenyl di-iso-propoxysilane, diphenyl di-n-butoxysilane, diphenyl di-sec-butoxysilane, diphenyl di-tert-butoxysilane, diphenyl diphenoxysilane, bis(3,3,3-trifluoropropyl)dimethoxysilane, and methyl(3,3,3-trifluoropropyl)dimethoxysilane. For the silica precursor in the present invention, the compounds represented by the general formula (1) may be used alone, or two or more kinds of the compounds may be used in combination.

It is preferable to use a catalyst to accelerate a reaction in hydrolysis and condensation of the compound represented by the general formula (1) for production of the raw material for forming a porous silica film used for the present invention. As for the catalyst, alkali catalysts can include onium salts, such as tetramethylammonium hydroxide, tetraethylammonium hydroxide, tetrapropylammonium hydroxide, and tetrabutylammonium hydroxide, for example. The above-mentioned catalysts may be used alone, or not less than two kinds of the catalysts may be used in combination. Further, acid catalysts can include organic acids such as formic acid, maleic acid, fumaric acid, acetic acid, propionic acid, butanoic acid, pentanoic acid, hexanoic acid, heptanoic acid, octanoic acid, nonanoic acid, decanoic acid, oxalic acid, adipic acid, sebacic acid, butyric acid, oleic acid, stearic acid, linoleic acid, linolenic acid, salicylic acid, benzoic acid, p-aminobenzoic acid, p-toluenesulfonic acid, phthalic acid, sulfonic acid, tartaric acid, and trifluoromethanesulfonic acid; and inorganic acids such as hydrochloric acid, phosphoric acid, nitric acid, boric acid, sulfuric acid, and fluoric acid.

Preferably, an amount of the catalyst to be used is in a range of 0.0001 moles to 1 mole relative to the compound represented by the general formula (1). A polymerization reaction is less likely to accelerate when the amount of the catalyst to be used is too small. On the other hand, gellation is likely to accelerate so that film formation properties reduce when the amount of the catalyst to be used is too large.

Alcohol generated as a by-product in the hydrolysis reaction may be removed using an evaporator or the like depending on a case.

Production of the raw material for forming the porous silica film used for the present invention needs water that exists in the hydrolysis and condensation reaction system of the compound represented by the general formula (1). The amount of water can be determined where relevant. However, when the content of water is too low, coating performance reduces, thereby having difficulties in ensuring a uniform thickness of a coated film. Moreover, when the content of water is too high, disadvantageously, preservation stability reduces. Preferably, in the present invention, the amount of water is within the range of 0.5 moles to 20 moles relative to 1 mole of the compound represented by the general formula (1).

Preferably, production of the raw material for forming the porous silica film used for the present invention includes a solvent that can dissolve the compound represented by the general formula (1). The solvent includes ether acetate solvents such as ethylene glycol methyl ether propionate, ethylene glycol ethyl ether propionate, acetate ethylene glycol methyl ether acetate, ethylene glycol ethyl ether acetate, diethylene glycol methyl ether acetate, diethylene glycol ethyl ether acetate, diethylene glycol n-butyl ether acetate, propylene glycol methyl ether acetate, propylene glycol ethyl ether acetate, propylene glycol propyl ether acetate, dipropylene glycol methyl ether acetate, and dipropylene glycol ethyl ether acetate. The solvent also includes ether glycol solvents such as ethylene glycol monomethyl ether, ethylene glycol monoethyl ether, ethylene glycol mono-n-hexyl ether, ethylene glycol monophenyl ether, ethylene glycol mono-2-ethylbutyl ether, propylene glycol monomethyl ether, propylene glycol monoethyl ether, propylene glycol monopropyl ether, diethylene glycol monoethyl ether, diethylene-glycol mono-n-butyl ether, diethylene-glycol mono-n-hexyl ether, dipropylene glycol monomethyl ether, and dipropylene glycol monoethyl ether. The solvent further includes alcoholic solvents such as methanol, ethanol, n-propanol, propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethyl nonyl alcohol, sec-tetradecyl alcohol, sec-heptadecyl alcohol, phenol, cyclohexanol, methyl cyclohexanol, benzyl alcohol, ethylene glycol, 1,2-propylene glycol, 1,3-butylene glycol, diethylene glycol, dipropylene glycol, triethylene glycol, and tripropylene glycol. The solvent also includes ketone solvents such as acetone, methyl ethyl ketone, methyl-n-propyl ketone, methyl-n-butyl ketone, methyl-1-butyl ketone, methyl-n-pentyl ketone, methyl-n-hexyl ketone, diethyl ketone, di-1-butyl ketone, trimethyl nonanone, cyclohexanone, cyclopentanone, methylcyclohexanone, 2,4-pentanedione, acetonylacetone, diacetone alcohol, acetophenone, and γ-butyrolactone. The solvent includes ether solvents such as ethyl ether, i-propyl ether, n-butyl ether, n-hexyl ether, 2-ethylhexyl ether, ethylene oxide, 1,2-propylene oxide, dioxolane, 4-methyl dioxolane, dioxane, and dimethyldioxane. The solvent also includes ester solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxy butyl acetate, methylpentyl acetate, 2-ethylbutyl acetate, 2-ethylhexyl acetate, benzyl acetate, cyclohexyl acetate, methylcyclohexyl acetate, nonyl acetate, γ-butyrolactone, γ-valerolactone, methyl acetoacetate, ethyl acetoacetate, glycal diacetate, methoxytriglycol acetate, ethyl propionate, n-butyl propionate, i-amyl propionate, diethyl oxalate, di-n-butyl oxalate, methyl lactate, ethyl lactate, n-butyl lactate, and n-amyl lactate. Moreover, the solvent includes alkylene glycol dialkyl ether solvents such as ethylene glycol dimethyl ether, triethylene glycol dimethyl ether, ethylene glycol diethylether, and ethylene glycol dibutyl ether; dialkylene glycol dialkyl ether solvents such as diethylene glycol dimethyl ether and diethylene glycol diethylether; and acetonitrile, N,N-dimethylformamide, N,N-dimethylacetamide and N,N-dimethyl sulfoxide, etc. These solvents may be used alone, or two or more kinds of the solvents may be used in combination.

The amount of the solvent to be used is preferably determined so that a siloxane oligomer may be contained in a concentration range of 3 to 25 mass-%. Stability, film formation properties, etc. are likely to reduce when the amount of the solvent to be used is too small. On the other hand, it is likely to be difficult to obtain a desired film thickness when the amount of the solvent to be used is too large.

Moreover, the raw material for forming the porous silica film used for the present invention needs to contain a pore generator (porogen). The pore generator can include vinyl ether compounds, vinylpyridine compounds, styrene compounds, alkyl ester vinyl compounds, (meth)acrylic acid compounds, and polymers having an alkylene oxide structure, for example. From a viewpoint of decomposition properties of the polymer and mechanical strength of the film, polymers having an alkylene oxide structure are preferable, and polymers having an ethylene oxide structure or a propylene oxide structure are particularly preferable.

The catalyst, water, the solvent, and the pore generator are added to the above-mentioned silica precursor. The mixture is stirred and synthesized to prepare the raw material for forming the porous silica film.

(Application Method)

The method for forming the porous silica film according to the present invention further includes an application process to apply the above-mentioned raw material for forming the porous silica film onto a substrate, and a prebaking process to vaporize the solvent from the applied raw material for forming the porous silica film. Thereby, the porous silica precursor film is formed on the substrate.

In the application process, the raw material for forming the porous silica film is applied onto the semiconductor substrate by a spin coating method, a scan coating method, etc. A silicon substrate, for example, can be used for the semiconductor substrate. Isolation regions; active elements such as a MOS transistor comprising a source/drain diffused layers and a gate electrode; and passive elements such as a capacitor and wiring may be formed on the semiconductor substrate. When the spin coating method is used, the applied film thickness can be controlled by adjusting the number of rotation. The scan coating method can control the applied film thickness by adjusting a discharge rate from a nozzle two-dimensionally extended.

Next, the prebaking process is performed to vaporize the solvent from the raw material for forming the porous silica film. This process is performed for the purpose of vaporizing and removing the solvent included in the raw material for forming the porous silica film. A heating temperature in pre-baking can be set where relevant depending on the kind of the solvent. However, the heating temperature is preferably lower than a decomposition temperature of the pore generator. Specifically, a heating temperature lower than 100° C. is more preferable, and a heating temperature higher than 80° C. is preferable. Vaporization and removal of the solvent tend to be insufficient at the heating temperature of not more than 80° C. A processing time is preferably 10 to 70 minutes, and more preferably 50 to 60 minutes. In the prebaking process of the present invention, a plurality of substrates can be simultaneously processed using a batchwise hot plate, a belt conveyor-type hot plate, or a furnace (electric furnace).

(Vapor-Phase Transport Treatment)

The method for forming the porous silica film according to the present invention includes a vapor-phase transport treatment to accelerate polymerization of the silica precursor included in the porous silica precursor film and simultaneously hydrophobize the silica precursor after the prebaking process. The vapor-phase transport treatment in the present invention means a process to expose the porous silica precursor film formed on the substrate to an atmosphere of organic amine vapor. Through this vapor-phase transport treatment, organic amine is diffused in the porous silica precursor film while the silica precursor is hydrophobized. Simultaneously, a part of the pore generator can be decomposed and volatilized. The method according to the present invention is designed so that a vapor used for the vapor-phase transport treatment contains no water vapor. In other words, it is designed so that no water is added to a solution to generate organic amine vapor with an intention. When water is added to the solution, the vapor includes much water vapor. As a result, hydrophobicity manifested in the silica precursor is likely to be insufficient. Additionally, control of the pore diameter becomes difficult, as described later. Water that remains in the porous silica precursor film after the prebaking process and a small amount of the water vapor derived from water generated in the dehydration and condensation process of the silica precursor are allowed. Moreover, water included as impurities in organic amine does not affect, either, as long as the amount of water is small.

Organic amines includes primary amines, such as methylamine, ethylamine, isopropylamine, normal butylamine, ethylenediamine, and hexanediamine; secondary amines such as dimethylamine, diethylamine, diisopropylamine, and dinormal butylamine; and tertiary amines such as trimethylamine, triethylamine, trinormal butylamine, and tetramethylethylene diamine. Ammonium salts such as a tetrapropylammonium aqueous solution (tetrapropylammonium hydroxide) are not usually included in organic amines. On the other hand, some of the above-mentioned organic amines, due to their lower boiling points, have difficulties in controlling an amount of vaporizing, or require a very complicated equipment configuration in order to ensure safety of an apparatus for the vapor-phase transport treatment. Therefore, in view of productivity, organic amines having a boiling point of not less than 50° C. and less than 250° C. and being a liquid at room temperature are preferable. Moreover, organic amines that are in a solid state at room temperature when used alone, and become liquefied when mixed with other organic amine that is a liquid at room temperature, or become liquefied at a temperature when the vapor treatment is started may also be used. As for the organic amine used for the vapor treatment, it is desirable to use one kind or a plurality of kinds of organic amines in combination selected from the group consisting of ethylenediamine (boiling point: 117° C.), hexanediamine (boiling point: 204° C.), normal butylamine (boiling point: 78° C.), diisopropylamine (boiling point: 84° C.), dinormal butylamine (boiling point: 160° C.), triethylamine (boiling point:

89° C.), trinormal butylamine (boiling point: 216° C.), and tetramethylethylene diamine (boiling point: 122° C.). In accordance with the required pore diameter, a single organic amine may be used or a plurality of organic amines may be used in combination for a solution. The organic amine preferably contains a primary diamine in order to control the pore diameter to be small, and contains a tertiary amine for more effective manifestation of hydrophobicity. Of the above-mentioned organic amines, it is preferable to use ethylenediamine and triethylamine at a volume ratio of 100:0 to 0:100 in a solution state for compatibility of pore diameter control and manifestation of hydrophobicity.

As a method of the vapor-phase transport treatment, a method of inserting a single substrate or a plurality of substrates into an autoclave where the organic amine solution is retained in the bottom and putting the entire autoclave into a baking furnace to heat the autoclave, or a method of heating by a belt conveyor-type apparatus including a bathtub where the organic amine solution is retained in the lower part can be used. The organic amine solution and the substrate having the porous silica precursor film formed are simultaneously heated at the same temperature in the former method, while the organic amine solution and the substrate are heated by different heating sources, and therefore, the heating temperature for the organic amine solution and that for the substrate can be separately controlled in the latter method.

Preferably, the heating temperature of the solution in the case of performing the vapor-phase transport treatment is not more than 250° C. and not less than the boiling point of each organic amine to be used. When the heating temperature is lower than the boiling point, generation efficiency of a vapor worsens. When the heating temperature becomes higher than 250° C., a configuration of an apparatus, such as a heating mechanism and a mechanism for preventing vapor leakage, becomes complicated.

The heating temperature of the substrate is preferably not less than 100° C. and not more than 450° C., and more preferably not less than 210° C. and not more than 250° C. At a heating temperature higher than 450° C., in a process of converting the porous silica precursor film into the porous silica film, local burst and cracks may be generated in the film. For that reason, it may be impossible for the film to serve function as an insulating film. In order to reduce complexity of the heating mechanism and the mechanism for preventing vapor leakage, the heating temperature is more preferably not more than 250° C. When the heating temperature is lower than 100° C., the organic amine vapor insufficiently diffuses in the porous silica precursor film so that the porous silica precursor film is imperfectly converted to the porous silica film. The vapor can be diffused efficiently at a heating temperature of not less than 100° C., and the diffusion reaction can be effectively accelerated at a heating temperature of not less than 210° C.

As for the processing time in the case of performing the vapor-phase transport treatment, 0.5 to 6 hours are preferable, and 1 to 6 hours are more preferable.

(Calcination)

In the method for forming the porous silica film according to the present invention, preferably, heat treatment is performed after the vapor-phase transport treatment as a calcination process to complete decomposition and volatilization of the pore generator. Even during the preceding vapor-phase transport treatment, decomposition and volatilization of the pore generator proceed. However, decomposition and volatilization of the pore generator are insufficient in the more preferable range of the vapor-phase transport treatment of not less than 210° C. and not more than 250° C. Accordingly, in order to complete the decomposition and volatilization of the pore generator, it is preferable to perform the calcination process. Although the heating temperature varies depending on a kind of the pore generator, the temperature is preferably not less than 350° C. and not more than 450° C., and more preferably not less than 390° C. and not more than 410° C. An atmosphere of the calcination process may have no limitation in particular, and may be in the air. Calcination time is preferably 3 to 5 hours, and more preferably 3.8 to 4.2 hours. Temperature is raised to a predetermined temperature at a heating rate of 1 to 20° C./min., and the calcination process is performed for a predetermined period of time. A baking furnace usually used can be used for the calcining process.

It is preferable to perform a rinse process to remove the organic amine adhering to the substrate at a point of time after the vapor-phase transport treatment and before the calcination process. The organic amine is removed by immersing the substrate in an organic solvent such as acetone or performing shower spraying, and the substrate is dried. Unless the rinse process is performed, foreign substances may remain on the surface of the porous silica film by drying the amine solution, and then, the substrate may become unsuitable for use in manufacturing the semiconductor device.

With the above-mentioned processes, the porous silica film having hydrophobicity and having a desired lower dielectric constant can be formed on the semiconductor substrate. A semiconductor device having a silicon oxide film of a low dielectric constant can be manufactured by using this porous silica film as an interlayer insulating film, for example, and then, forming contacts, interconnects, and the like in accordance with known methods.

EXAMPLE

FIG. 1 shows a flow chart of production according to an experiment of the present invention. Tetraethoxy silane (TEOS); water to hydrolyze TEOS; ethanol used as a solvent; tetrabutylammonium hydroxide (TBAOH), which is a quaternary ammonium used as a catalyst; a surfactant, which is a pore generator (Brij78: trade name, polyoxyethylene (20) stearyl ether); and 1-butanol (1-BtOH) serving as a solvent for the pore generator were prepared as a silica precursor solution (S1). In order to remove metal ions and other impurities, an ion exchange resin was used to refine TBAOH (S2). Ethanol and water were added to the refined TBAOH, and the mixture was stirred. Furthermore, TEOS was dropped to the mixture (S3), and the mixture was stirred at 50° C. for 24 hours to hydrolyze TEOS(S4). The surfactant (Brij78) dissolved in 1-butanol (1-BtOH) was refined using the ion exchange resin, and subsequently dropped into the solution including TEOS while being stirred (S5). Stirring was further performed at 30° C. for five hours to prepare a raw material for forming a porous silica film (S6).

A mole ratio of a final raw material solution for forming the porous silica film was TEOS:TBAOH:$H_2O$:EtOH:1-BtOH: Brij78=1:0.32:7.8:19.5:7.4:0.09.

After the raw material for forming the porous silica film was produced, the raw material was applied onto a semiconductor substrate at 2000 rpm by a spin coating method so that the applied raw material might have a thickness of 500 nm. The thickness of the applied film can be controlled by the number of rotations (S7). Subsequently, the substrate was prebaked in the air at 90° C. for one hour to volatilize moisture and an alcohol content. Thus, the porous silica precursor film was formed (S8).

Figure 2:
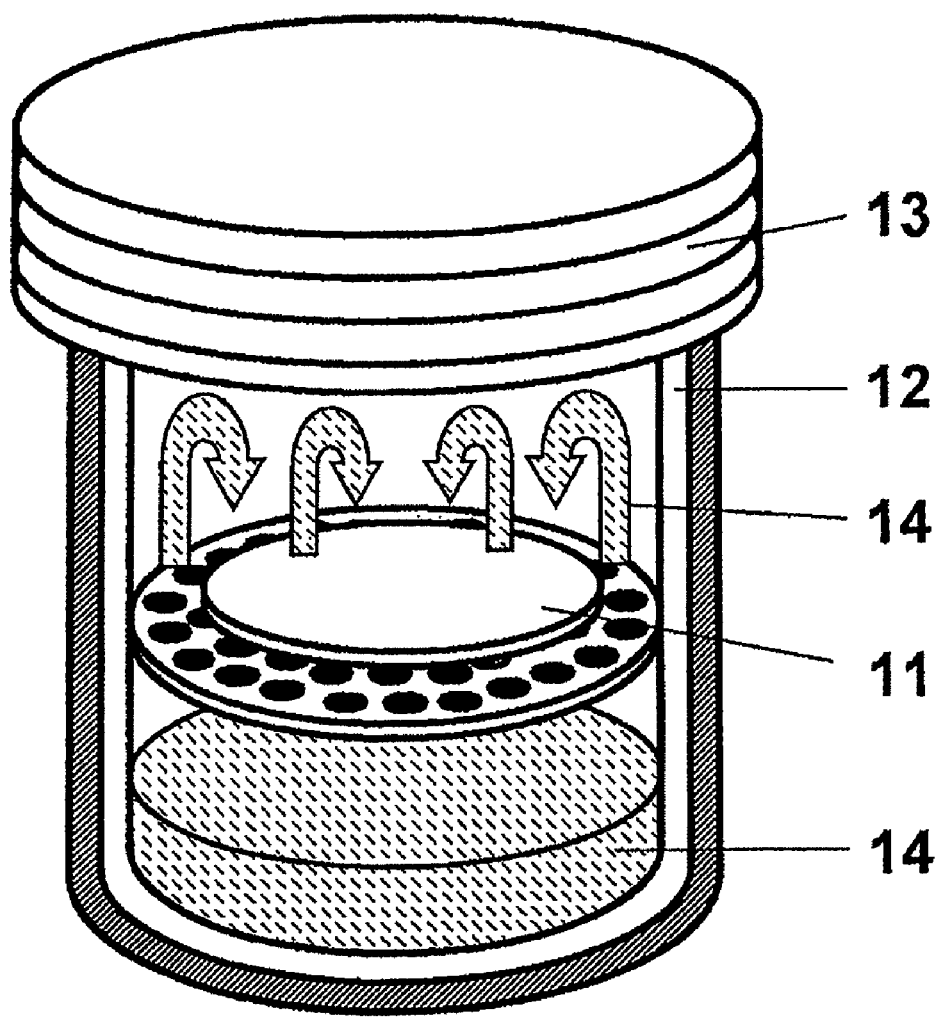
FIG. 2 is a schematic view illustrating an autoclave for vapor-phase transport treatment used in the one example of the present invention.

FIG. 2 shows a diagram of a vapor treatment (S9) in which an autoclave and organic amine were used. Semiconductor substrate 11 subjected to coating and prebaking was installed in container 12 made of "Teflon" (registered trademark) and autoclave 13 made of stainless steel. Organic amine solution 14 was retained at the bottom of container 12. A stage was provided within container 12 so that organic amine solution 14 and semiconductor substrate 11 might not contact each other directly, and semiconductor substrate 11 was placed on the stage. The stage was provided with a plurality of throughholes through which a vapor of the organic amine solution passed. After semiconductor substrate 11 was placed, autoclave 13 was installed within a baking furnace, and the vapor treatment was performed at 210° C. for two hours. Ethylenediamine (EDA) and triethylamine ($Et_3N$) were selected in the present experiment among the above-mentioned suitable organic amines such as ethylenediamine, hexanediamine, normal butylamine, diisopropylamine, dinormal butylamine, triethylamine, trinormal butylamine, and tetramethylethylene diamine. As a processing condition, a volume ratio of ethylenediamine and triethylamine in a solution state was varied. After the vapor treatment was performed, the semiconductor substrate taken out from the processing apparatus was rinsed using acetone to remove the organic amine adhering thereto, and further dried. Subsequently, the semiconductor substrate was placed in a baking furnace, heated to 400° C. at a heating rate of 2° C./min., and calcination was performed in the air for four hours (S10).

Figure 3:
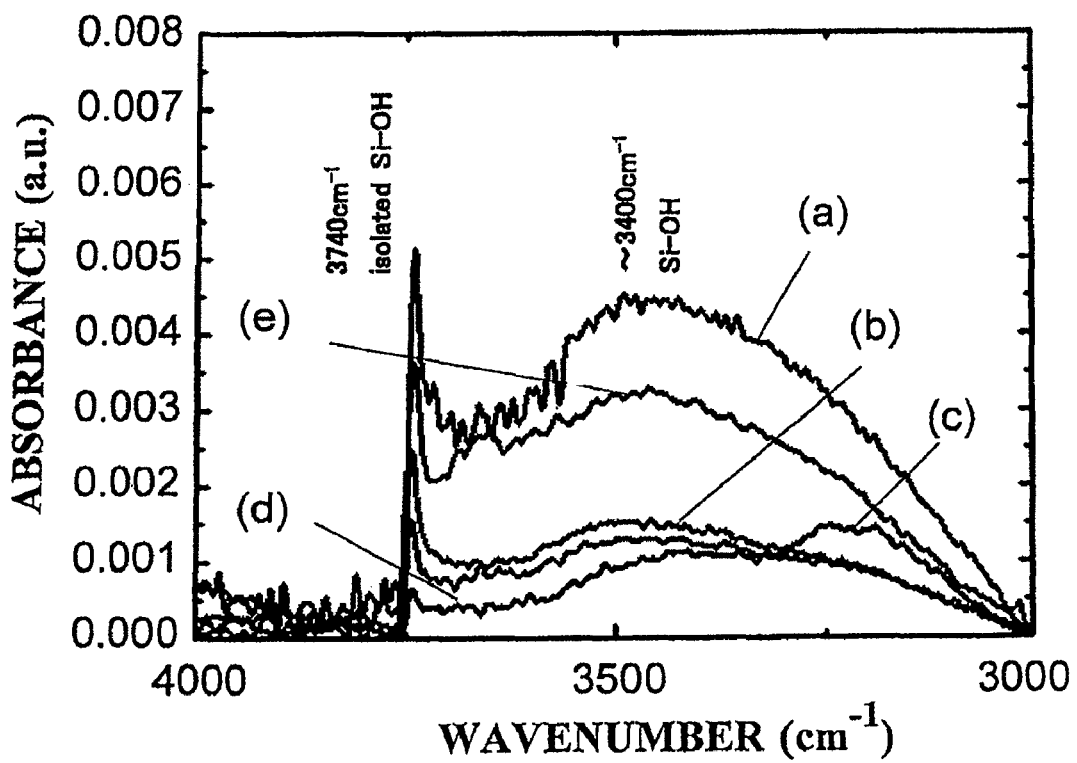
FIG. 3 is an absorbance spectrum diagram on the basis of measurement with an FT-IR illustrating an effect of hydrophobic treatment.

FIG. 3 shows an absorption spectrum of a sample subjected to the vapor treatment, which is measured by Fourier transform infrared absorption measurement (FT-IR). This measurement shows that bonds (Si—OH) attributed to water included in the film increase as a peak value of the absorption spectrum becomes higher. The measured samples were Sample (a) not subjected to the vapor treatment; Sample (b) having EDA of 100 Vol % and no water added; Sample (c) having EDA/$Et_3N$ of 50 Vol %/50 Vol % and no water added; Sample (d) having $Et_3N$ of 100 Vol % and no water added; Sample (e) having EDA/$Et_3N$ of 50 Vol %/50 Vol % and further water added. Compared with Sample (a) not subjected to the vapor treatment, the number of Si—OH groups decreases and hydrophobicity manifests in Samples (b), (c), and (d) subjected to the vapor treatment without added water, irrespective of the volume ratio. On the other hand, in Sample (e) having EDA/$Et_3N$ of 50 Vol %/50 Vol % and water added, apparently, decrease in the number of Si—OH groups is limited and manifestation of hydrophobicity is insufficient.

Figure 4:
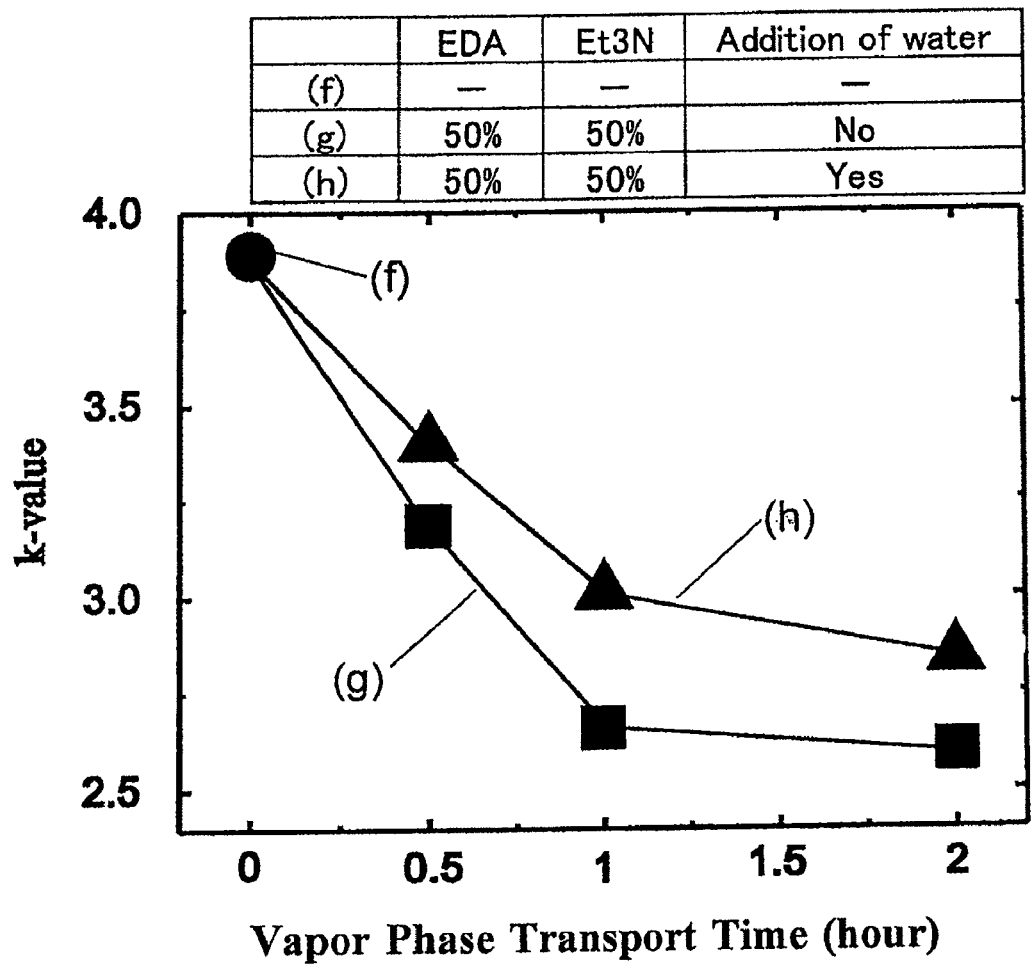
FIG. 4 is a graph showing vapor-phase transport time dependency of a dielectric constant.

FIG. 4 shows transport time dependency of a dielectric constant by the vapor treatment. The dielectric constant was determined as follows. A porous silica film was formed on a silicon substrate. A metal electrode having a known area was formed on the surface of the porous silica film to configure a capacitor. A capacitance of the capacitor was measured on the basis of voltage-capacitance characteristics. Then, the dielectric constant was determined on the basis of the capacitance value obtained, while an area of the electrode and a thickness of the porous silica film were taken into consideration. Sample (f) shows an evaluation result when no vapor treatment was performed. It turns out that the vapor treatment reduces the dielectric constant (k-value). Moreover, compared with Sample (h) in which water was added to EDA and $Et_3N$, Sample (g) having no added water has a more reduced dielectric constant. While Sample (g) shows a tendency to reduce monotonically with progress of the vapor-phase transport time, it also shows a tendency to be saturated when one hour passes. A dielectric constant of 2.7 was obtained in the case of the vapor-phase transport time of one hour, and that of 2.6 was obtained in the case of the vapor-phase transport time of two hours.

Figure 5:
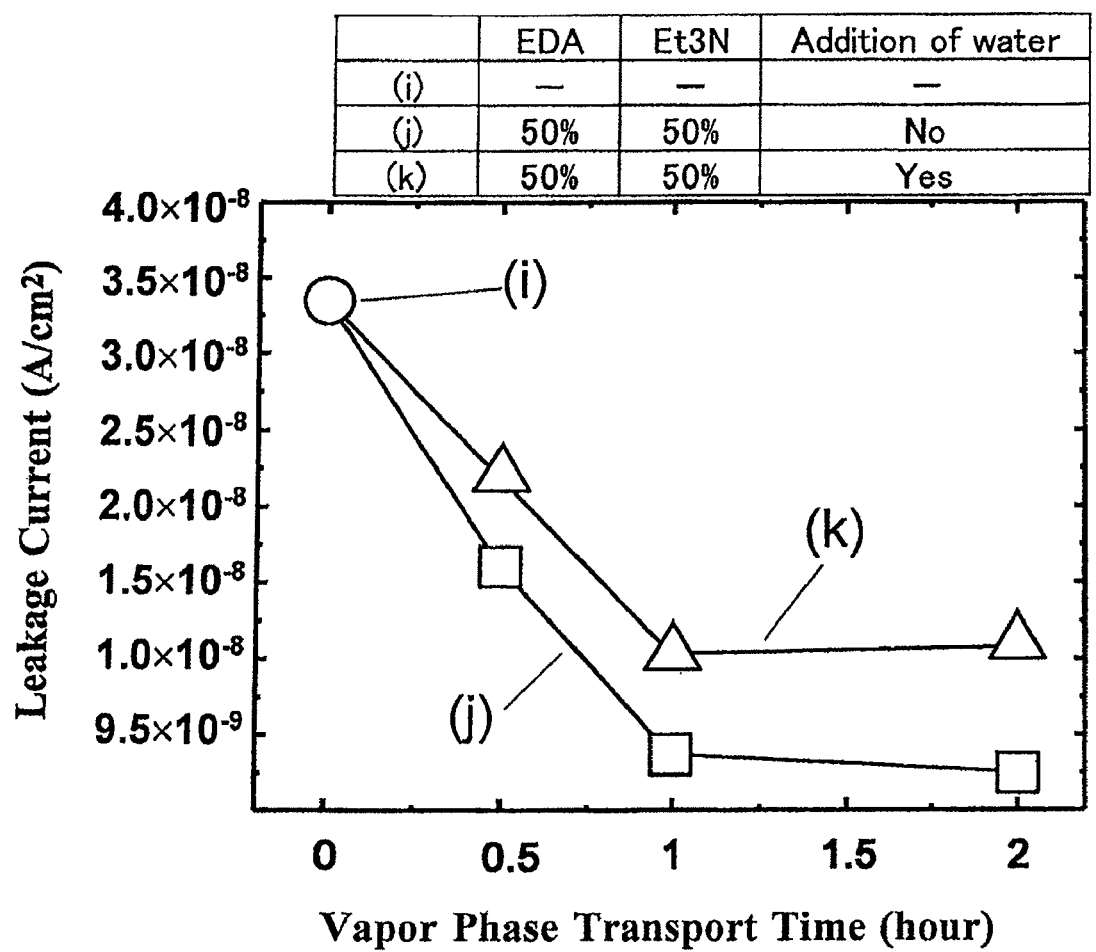
FIG. 5 is a graph showing vapor-phase transport time dependency of leakage current.

FIG. 5 shows time dependency of leakage current by the vapor treatment. Usually, it is demanded that leakage current in an insulating film used for manufacturing a semiconductor device should be smaller than $1.0 \times 10^{-8}$ A/cm². Sample (i) shows the result when no vapor treatment was performed. Sample (k) shows the result when EDA/$Et_3N$ was 50 Vol %/50 Vol %, and water was further added. Sample (j) shows the result when EDA/$Et_3N$ was 50 Vol %/50 Vol % and no water wad added. In each case, it turns out that the vapor treatment reduces the leakage current. However, Sample (k), in which water was added to EDA and $Et_3N$, shows a tendency for decrease in the leakage current to be saturated in one hour. Accordingly, it is difficult to maintain the leakage current smaller than $1.0 \times 10^{-8}$ A/cm². On the other hand, Sample (j) having no added water shows a leakage current value of not more than $9.5 \times 10^{-9}$ A/cm² when the vapor-phase transport time is longer than one hour, and it turns out that Sample (j) has sufficient practicality.

Figure 6:
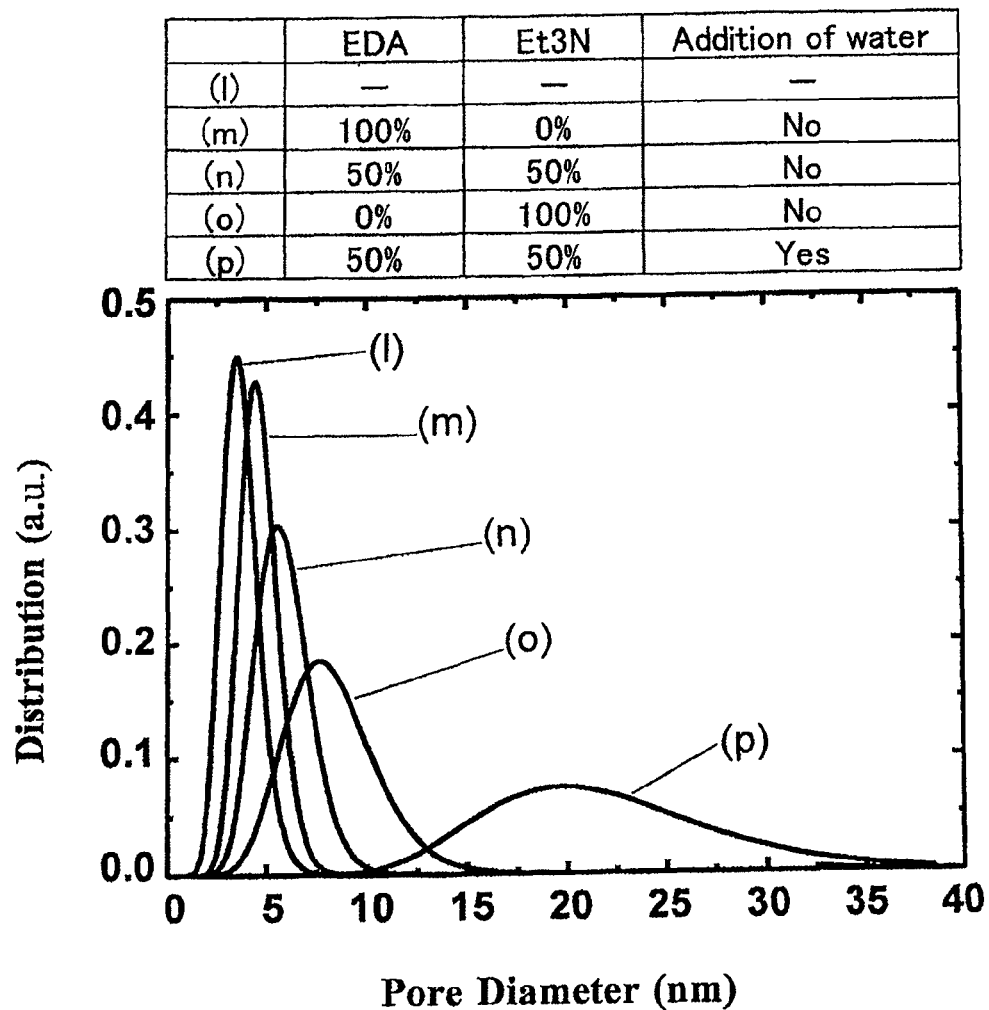
FIG. 6 is a graph showing changes in distribution of a pore diameter in a volume ratio of ethylenediamine to triethylamine in the vapor-phase transport treatment.
Figure 7A:
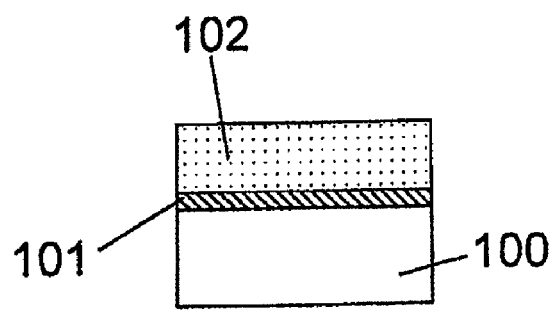
FIG. 7A to FIG. 7D are process sectional views illustrating an example of manufacturing of a semiconductor device according to the present invention.
Figure 7B:
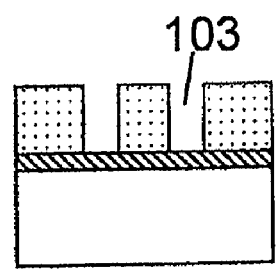
Figure 7C:
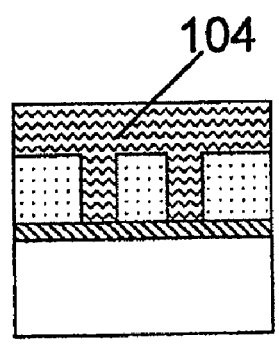
Figure 7D:
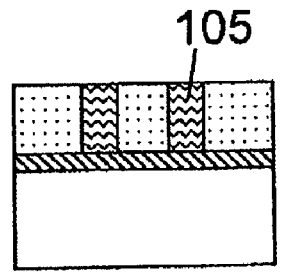

FIG. 6 shows dependency of pore diameter distribution measured by a small angle X-ray scattering method on the volume ratio of EDA and $Et_3N$. It turns out that a pore size (average pore diameter) increases as a proportion of $Et_3N$ increases. Since the average pore diameter is approximately equal to a peak value of the pore diameter distribution, the peak value of the pore diameter distribution is defined as the average pore diameter herein. When water is added to EDA and $Et_3N$, the pore diameter size increases. Measured samples were Sample (l) not subjected to the vapor treatment, Sample (m) having EDA of 100 Vol % and no water added, Sample (n) having EDA/$Et_3N$ of 50 Vol %/50 Vol % and no water added, Sample (o) having $Et_3N$ of 100 Vol % and no water added, and Sample (p) having EDA/$Et_3N$ of 50 Vol %/50 Vol % and added water. The average of the pore diameter of Sample (l) not subjected to the vapor treatment was 3 nm, which was the smallest value among the results. However, the sample has no hydrophobicity manifested as mentioned above, has difficulties in reduction of the dielectric constant and leakage current, and lacks in practicality. The pore diameters of Sample (m), (n), and (o) subjected to the vapor treatment without adding water were 4 nm, 6 nm, and 8 nm, respectively. A smaller average pore diameter was obtained in Sample (m) having EDA 100 Vol %. The average pore diameter of Sample (o) having $Et_3N$ 100 Vol % was 8 nm. Sample (m) having EDA/$Et_3N$ of 50 Vol %/50 Vol % showed a middle value between a value when EDA was used alone and that when $Et_3N$ was used alone. Consequently, a desired average pore diameter can be obtained by adjusting the volume ratio of EDA and $Et_3N$. On the other hand, Sample (p) having 50 Vol %/50 Vol % of EDA/$Et_3N$ and added water had an average pore diameter of approximately 20 nm, and had wider pore diameter distribution. It shows that control of the pore diameter is difficult in the vapor treatment when water is added. The interlayer insulating film used for the manufacturing process of the semiconductors is exposed to an environment where heat stress and mechanical stress are applied. In such view, existence of a larger pore diameter causes reduction of mechanical strength, and is not preferable.

According to the present example, with the vapor treatment using an organic amine such as EDA, $Et_3N$, or combination of these with no added water, the average pore diameter can be controlled in the range of 4 to 8 nm while hydrophobicity of the porous silica film being maintained. Thus, a low dielectric constant film made of a porous silica film having a dielectric constant of approximately 2.5 and a leakage current smaller than $1.0 \times 10^{-8}$ A/cm² and having excellent mechanical strength as well can be obtained.

(Application)

FIG. 7A to FIG. 7D are process sectional views showing an example of a semiconductor device in which a porous silica film formed using the vapor treatment is used. Here, description will be given on an example in which a cupper interconnect is formed by a damascene method. Barrier film 101 such as an $Si_3N_4$ film is formed on semiconductor substrate (Si wafer) 100. Subsequently, porous silica film 102 is formed (coating→vapor treatment→calcination) (process (a)). Hard masking, resist application, exposure and development, and etching are performed, and desired circuit pattern 103 is formed in porous silica film 102 (process (b)). Cu film 104 is formed by a plating method on the whole surface, and subsequently annealing is performed when necessary (process (c)). Finally, Cu interconnect 105 is formed by removing Cu on porous silica film 102 using a chemical machinery polishing method (CMP) (process (d)).

Moreover, a metal interconnect can also be formed by burying a groove formed in an interlayer insulating film and a contact hole formed on a part of a bottom surface of the groove.

It is apparent that the present invention is not limited to the above embodiments, but may be modified and changed without departing from the scope and spirit of the invention.

What is claimed is:

1. A semiconductor device having a multilevel interconnect structure, comprising a metal interconnect and an interlayer insulating film, layered each other, on a semiconductor substrate, wherein
    the interlayer insulating film includes a porous silica film having a dielectric constant of 2.7 or less,
    wherein the porous silica film is a film having a pore diameter of 4 to 8 nm shown as an average of a diameter and showing a leakage current less than $1.0 \times 10^{-8}$ $A/cm^2$.

2. The semiconductor device according to claim 1, wherein the metal interconnect is formed by burying a groove formed in the interlayer insulating film.

3. The semiconductor device according to claim 1, wherein the metal interconnect is formed by burying a groove formed in the interlayer insulating film and a contact hole formed on a part of a bottom surface of the groove.

4. The semiconductor device according to claim 1, wherein the metal interconnect is a cupper interconnect.

5. The semiconductor device according to claim 1, wherein the porous silica film is obtainable by a production method comprising:
    forming a porous silica precursor film on a substrate by applying a raw material for forming the porous silica film to the substrate;
    performing a vapor-phase transport treatment on the porous silica precursor film by exposing the porous silica precursor film formed on the substrate to an atmosphere of an organic amine vapor to which no water is added; and
    performing a calcination heat treatment on the porous silica precursor film after the vapor-phase transport treatment.

6. The semiconductor device according to claim 5, wherein the organic amine contains at least a primary diamine.

7. The semiconductor device according to claim 6, wherein the primary diamine is ethylenediamine.

8. The semiconductor device according to claim 5, wherein the organic amine contains at least a tertiary amine.

9. The semiconductor device according to claim 8, wherein the tertiary amine is triethylamine.

10. The semiconductor device according to claim 5, wherein ethylenediamine and triethylamine are used in the organic amine at a volume ratio of 100:0 to 0:100 in a solution state; and the pore diameter is controlled by adjusting a mixing ratio in volume of ethylenediamine and triethylamine.

11. The semiconductor device according to claim 5, wherein the vapor-phase transport treatment is a treatment to hydrophobize the porous silica film, and thereby to prevent moisture absorption by the porous silica film.

12. The semiconductor device according to claim 5, wherein the vapor of the organic amine in the vapor treatment is generated by heating the organic amine to a temperature range of not less than a boiling point of the organic amine and not more than 250° C.

13. The semiconductor device according to claim 5, wherein a temperature of the substrate in the vapor-phase transport treatment is set at 100° C. to 450° C.

14. The semiconductor device according to claim 5, wherein the vapor-phase transport treatment is performed for one to six hours.

15. The semiconductor device according to claim 5, further comprising, after the vapor-phase transport treatment and before the calcination heat treatment,
    rinsing to remove the organic amine adhering to a surface of the substrate; and
    drying subsequent to the rinsing.

16. The semiconductor device according to claim 5, wherein the raw material for forming the porous silica film is produced by synthesis by stirring a silica precursor, a catalyst, water, a solvent, and a pore generator; and the calcination heat treatment is to convert the porous silica precursor film into a porous silica film by decomposing and volatilizing the pore generator not decomposed during the vapor treatment.

17. The semiconductor device according to claim 5, wherein in the calcination heat treatment, a temperature of the substrate is raised from room temperature to 400° C. at a rate of 1 to 20° C./min., and the substrate is heated for one to six hours.

* * * * *